United States Patent
Eriksson et al.

(10) Patent No.: US 6,549,153 B2
(45) Date of Patent: Apr. 15, 2003

(54) DIGITAL TO ANALOG CONVERSION METHOD AND APPARATUS

(75) Inventors: Patrik Eriksson, Kolmården (SE); Peter Petersson, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/973,805

(22) Filed: Oct. 11, 2001

(65) Prior Publication Data
US 2002/0047793 A1 Apr. 25, 2002

Related U.S. Application Data

(60) Provisional application No. 60/242,775, filed on Oct. 25, 2000.

(51) Int. Cl.[7] .................................................. H03M 1/66
(52) U.S. Cl. ...................... 341/144; 455/209; 375/297; 375/344
(58) Field of Search .......................... 341/144; 375/344, 375/270, 297; 370/330, 474, 208; 348/181; 332/103; 330/149

(56) References Cited

U.S. PATENT DOCUMENTS

| | | | |
|---|---|---|---|
| 5,010,585 A | | 4/1991 | Garcia |
| 5,392,460 A | * | 2/1995 | Mattila et al. ............... 455/209 |
| 5,428,643 A | * | 6/1995 | Razzell ........................ 332/103 |
| 5,534,828 A | * | 7/1996 | Okada et al. ................ 332/103 |
| 5,566,164 A | * | 10/1996 | Ohlson ........................ 370/208 |
| 5,768,268 A | * | 6/1998 | Kline et al. ................. 370/330 |
| 5,886,573 A | * | 3/1999 | Kolanek ....................... 330/10 |
| 5,937,011 A | * | 8/1999 | Carney et al. .............. 375/297 |
| 5,956,373 A | * | 9/1999 | Goldston et al. ........... 332/103 |
| 5,959,499 A | * | 9/1999 | Khan et al. ................. 330/149 |
| 5,970,105 A | * | 10/1999 | Dacus ......................... 375/344 |
| 6,032,028 A | | 2/2000 | Dickey et al. |
| 6,233,253 B1 | * | 5/2001 | Settle et al. ................ 370/474 |
| 6,289,056 B1 | * | 9/2001 | Dartois ........................ 375/240 |
| 6,437,822 B1 | * | 8/2002 | Stolen ......................... 348/181 |

FOREIGN PATENT DOCUMENTS

| | | |
|---|---|---|
| JP | 8-204558 | 8/1996 |
| WO | 99/67878 | 12/1999 |

* cited by examiner

*Primary Examiner*—Jean Bruner Jeanglaude

(57) ABSTRACT

A digital-to-analog circuit arrangement that can be used, for example, in radio transmitters, includes a Digital-to-Analog Converter (DAC) whose output is connected directly to a mixer. A periodic signal is also provided to the mixer. The frequency of the periodic signal provided to the mixer, is an integer multiple of half the update rate frequency of the DAC. In an embodiment of the invention, the frequency of the periodic signal provided to the mixer, is half the update rate frequency of the DAC. An intermediate frequency (IF) filter can be provided. downstream of the mixer.

22 Claims, 8 Drawing Sheets

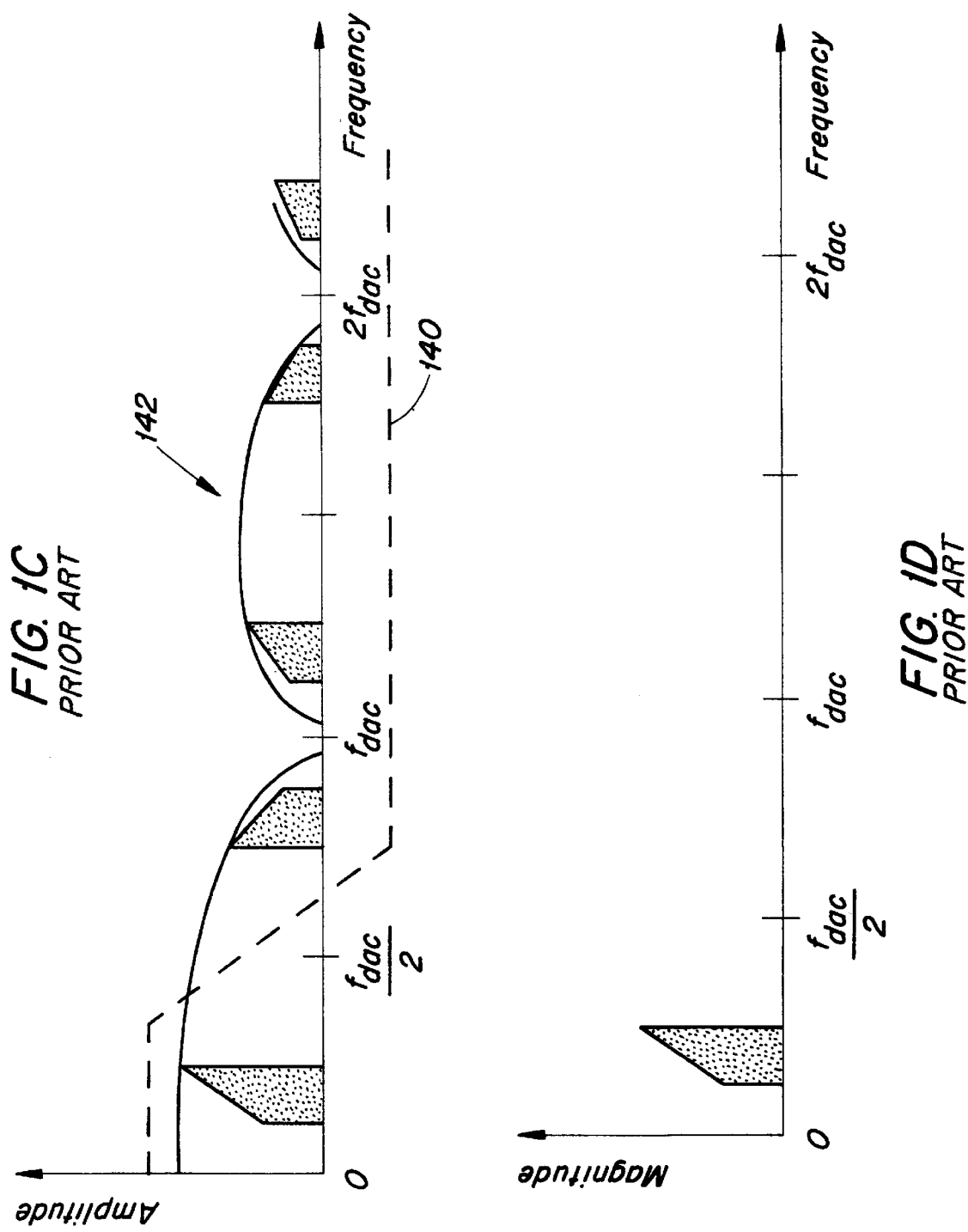

DIGITAL TO ANALOG CONVERSION METHOD AND APPARATUS

This application claims priority from U.S. Provisional Application No. 60/242,775, filed on Oct. 25, 2000 in the English language, which is hereby incorporated by reference.

BACKGROUND OF THE INVENTION

1. Field of the Invention

The invention relates generally to the field of digital-to-analog conversion, and particularly to digital-to-analog conversion in radio transmitters.

2. Background Information

Digital-to-Analog Converters (DACs) are often found in signal generation applications such as radio transmitters. See for example U.S. Pat. No. 6,032,028 and U.S. Pat. No. 5,010,585.

As shown in FIGS. 1A–1D, the signal at the analog output of a DAC contains not only the desired signal, but also alias signals (or spectral copies) which have to be removed in a reconstruction filter, as shown for example in FIGS. 1A–1D.

As shown in FIG. 1A, a digital input signal is provided to an input 102 of the DAC 104. An output 106 from the DAC 104 provides an analog signal to an input of a reconstruction filter 108, and the reconstruction filter 108 outputs a reconstructed analog signal on its output 110. FIG. 1B shows a magnitude spectrum of the digital signal provided to the input 102 of the DAC 104.

The spectral copies in the output from the DAC 104, fall off in amplitude as (sin(x))/x due to the zero-order hold (ZOH) of the DAC. This can be seen in FIG. 1C, which shows a magnitude spectrum of the signal output from the DAC 104. The sinc response 142 behavior of the magnitude spectrum of the signal, which is due to the ZOH of the DAC, can be seen in FIG. 1C. FIG. 1C also shows an ideal frequency response 140 of the reconstruction filter 108. FIG. 1D shows a magnitude spectrum of the signal output in the transmit frequency spectrum from the reconstruction filter 110, when the reconstruction filter 110 operates in accordance with the ideal frequency response 142.

For performance reasons, the DAC outputs a desired signal at a fairly low frequency. Consequently, the reconstruction filter 108 is often implemented using discrete LC technology. If high filter performance is required, the filter will often be bulky and require trimming.

In a typical radio transmitter known in the prior art, the output signal from the DAC is frequency upconverted in a mixer after passing through the reconstruction filter. An example of this is shown in FIG. 2, where an output of the reconstruction filter 108 is provided to a mixer 212. The mixer 212 mixes the output from the reconstruction filter 108 with a signal from a local oscillator 214. The frequency of the signal from the local oscillator 214 is represented as $f_{LO}$. The output of the mixer 212 is provided to an IF filter 216.

In typical frequency mixers, the input signal is not only frequency-translated with the local oscillator frequency $f_{LO}$, but is also frequency-translated with its odd harmonics. Any of the spectral copies that survive the reconstruction filter 110, or that are present in circuit configurations where the signal from the DAC 104 is provided directly to the mixer 212 (i.e., no reconstruction filtering is performed) can cause unacceptable distortion in or close to the signal band of interest. The distortion occurs because the spectral copies mix with the fundamental or harmonic frequencies of the local oscillator 214. FIGS. 3A, 3B show an example of this distortion.

FIG. 3A shows a magnitude spectrum of a signal provided from the DAC 104 directly to the mixer 212 (where no reconstruction filtering is performed). FIG. 3B shows a magnitude spectrum of an output signal from the mixer 212, which results when the signal of FIG. 3A and the signal from the local oscillator 214 are input to the mixer 212. For the sake of illustration, the harmonics of the local oscillator 214 are assumed to have the same magnitude level as the fundamental frequency $f_{LO}$ of the local oscillator 214.

If the mixer 212 is well balanced, then only odd-order harmonics are of practical importance. These odd-order harmonics fall off in amplitude approximately following a Fourier series expansion of a square wave. The spectrum of the output of the mixer is simply found by displacing the double-sided spectrum of the output signal from the DAC, by all possible integer multiples (positive and negative) of the local oscillator frequency $f_{LO}$.

For these reasons, the reconstruction filter 108 needs to be placed before the mixer 212. The filter requirements will become dependent on the frequency plan of the transmitter. In narrowband transmitters, its is possible through careful frequency planning to prevent frequency-converted spectral copies from appearing inside the frequency band of interest. For transmitters having bands wider than narrowband transmitters, effective frequency plans are very difficult to achieve due to the larger bandwidth of the signal.

Moreover, high performance DACs usually have current source output, and suffer from decreasing linearity as the voltage swing over the load of the DAC increases. It is hence beneficial to keep the load impedance as low as possible, in order to help the DAC perform in as linear a fashion as possible. On the other hand, the linearity of some types of mixers is enhanced or benefitted by driving the mixer with a current source (i.e., high impedance source). However, it is not possible to provide both a low impedance load for the DAC, and a high impedance source for the mixer, without signal attenuation which in turn degrades the attainable signal-to-noise ratio (SNR). In summary, the following problems exist in prior art systems: 1) a bulky and often expensive reconstruction filter is required in front of the mixer, and 2) the reconstruction filter cannot present both an optimal load for the DAC, and an optimal source for the mixer, without causing signal loss. Accordingly, a need exists for a system to overcome these problems.

SUMMARY OF THE INVENTION

In accordance with exemplary embodiments of the invention, a circuit is presented that eliminates the need for a bulky filter between the DAC and the mixer, and provides both a very low load impedance to the DAC, and a high source impedance to the mixer. In accordance with an exemplary embodiment of the invention, the DAC is connected directly to the mixer, and an IF filter after the frequency upconversion (i.e., located downstream of the mixer) is used as a reconstruction filter. In addition to eliminating the bulky prior art reconstruction filter between the DAC and the mixer, a direct connection between the DAC and the mixer provides the DAC with a low-impedance load, and provides the mixer with a high-impedance source because the DAC and the mixer are effectively current-matched. In accordance with an embodiment of the invention, the update rate of the DAC, $f_{DAC}$, is related to the frequency of the local oscillator by the following relation: $f_{LO}=(n/2)(f_{DAC})$, where n is any positive integer. In an exemplary embodiment of the invention, n=1 so that $f_{LO}=(f_{DAC})/2$.

BRIEF DESCRIPTION OF THE DRAWINGS

Other objects and advantages of the present invention will become apparent to those skilled in the art from the following detailed description of preferred embodiments, when read in conjunction with the accompanying drawings wherein like elements have been designated with like reference numerals and wherein:

FIGS. 1B–1D show magnitude spectra of signals at various points of the FIG. 1A circuit arrangement.

DETAILED DESCRIPTION OF THE PREFERRED EMBODIMENTS

Figure 1A:
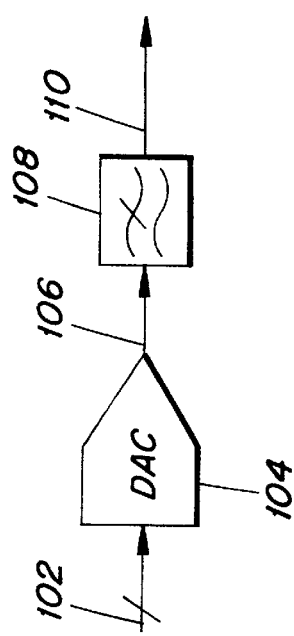
FIG. 1A shows a prior art circuit arrangement.
Figure 1B:
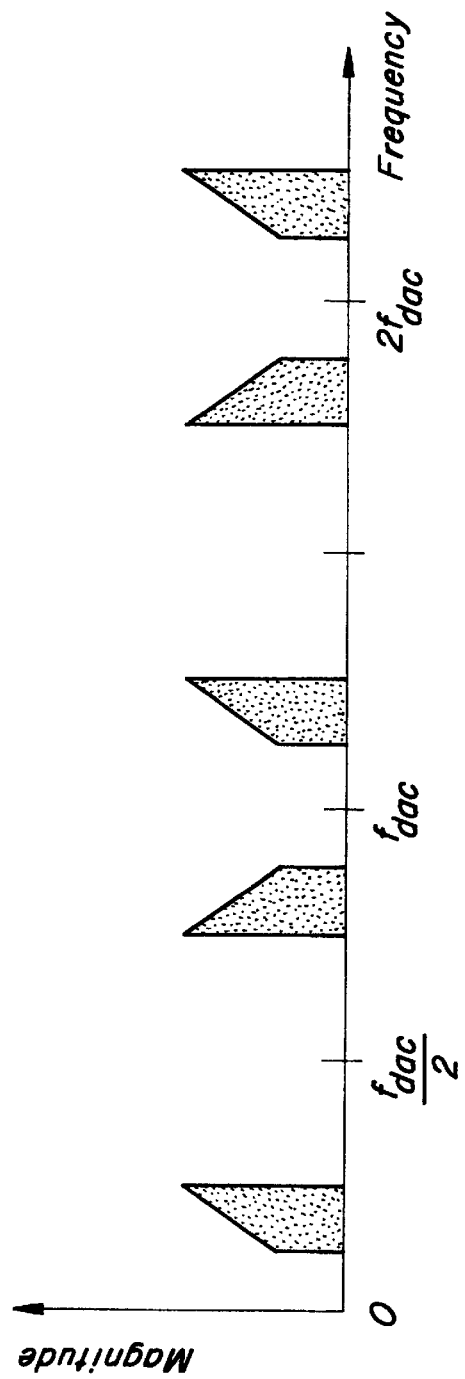
Figure 2:
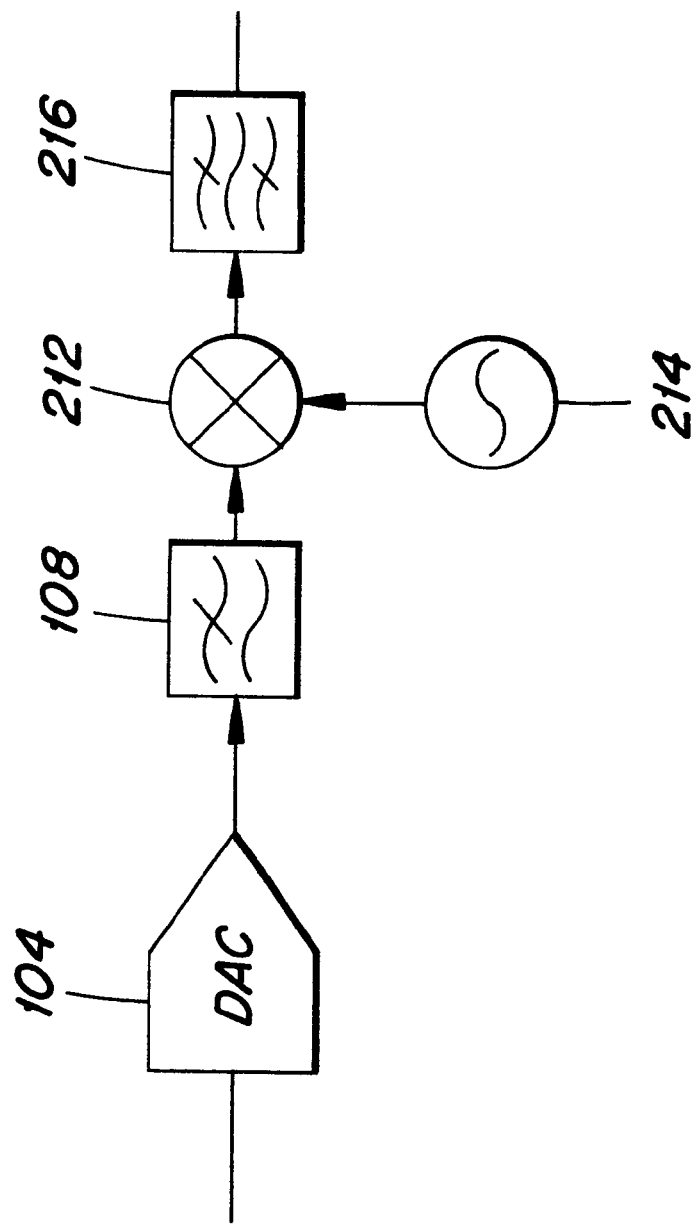
FIG. 2 shows a prior art circuit arrangement.
Figure 3A:
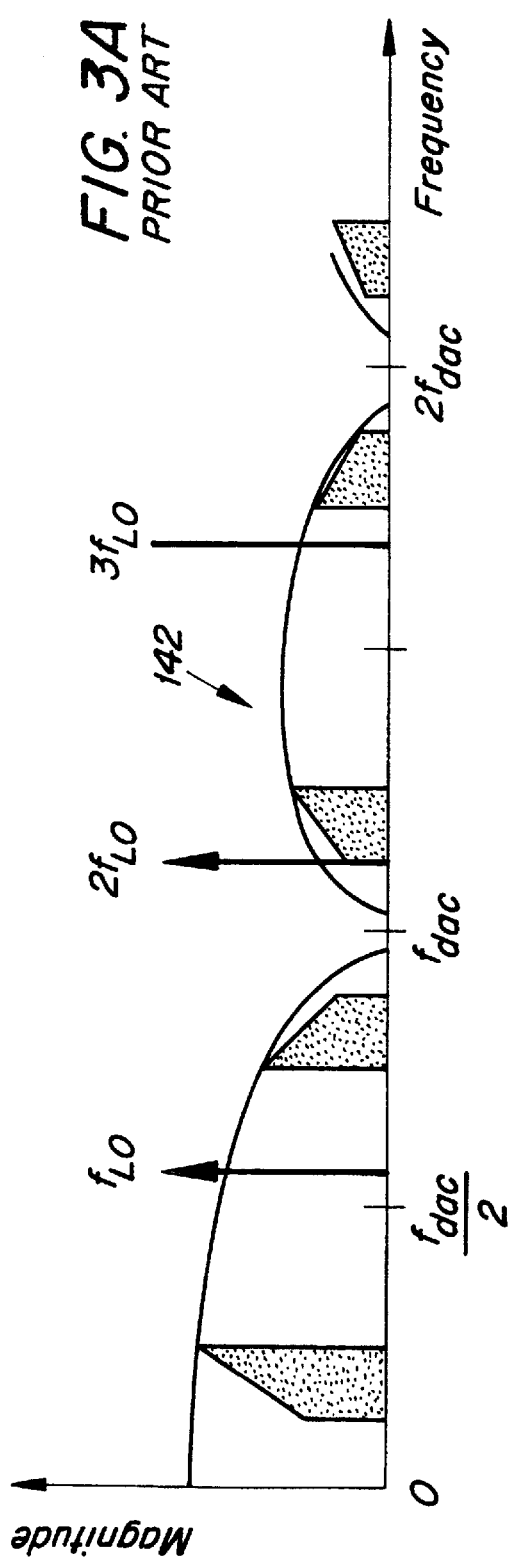
FIG. 3A shows a magnitude spectrum of an output signal from the DAC shown FIG. 2.
Figure 3B:
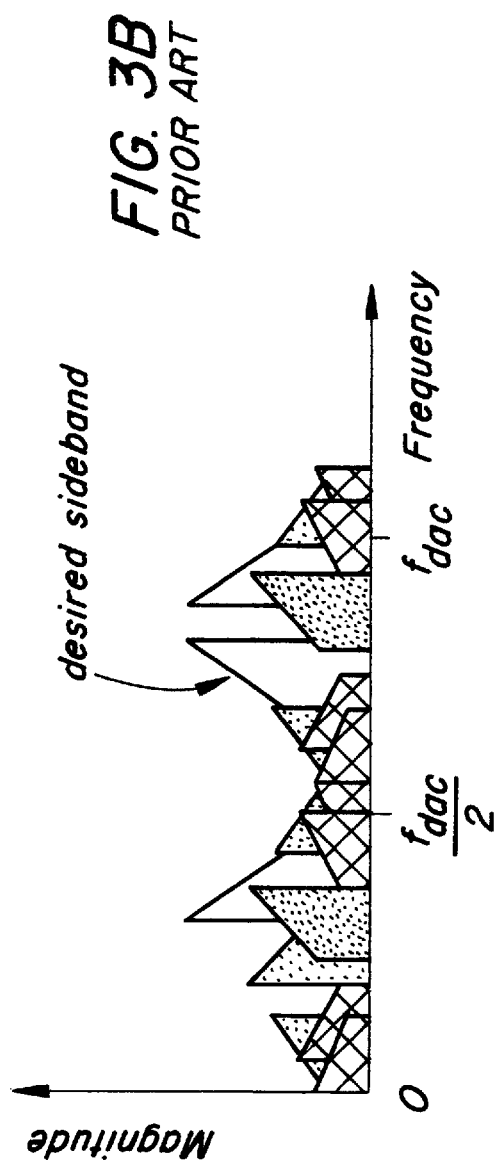
FIG. 3B shows an exemplary magnitude spectrum of an output signal from the mixer shown in FIG. 2, when the reconstruction filter is omitted.
Figure 4A:
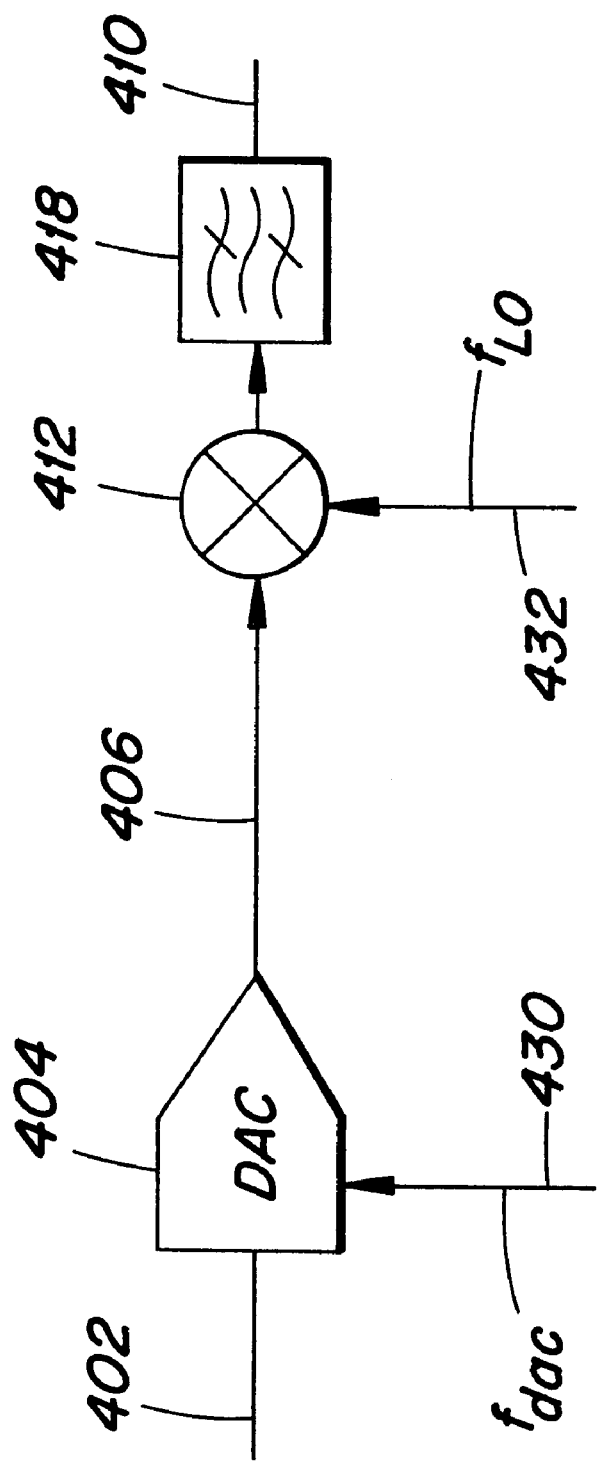
FIG. 4A shows a circuit arrangement in accordance with an exemplary embodiment of the invention.

FIG. 4A illustrates an exemplary embodiment of the present invention, wherein a digital signal is provided to an input 402 of a DAC 404. An output 406 of the DAC 404 connects to an input of a mixer 412, and an output of the mixer 412 connects to an input of an intermediate frequency (IF) filter 418.

The IF filter 418 outputs the filtered analog signal. In accordance with an exemplary embodiment of the invention, the IF filter 418 is used in place of a reconstruction filter.

In accordance with an exemplary embodiment of the invention, the mixer 412 output frequency is used as an Intermediate Frequency, which is processed further (mixed again), and/or used as an output and later power amplified.

A periodic signal 430 having a frequency $f_{DAC}$ is input to the DAC 404. The frequency $f_{DAC}$ reflects the update rate of the DAC 404. A periodic signal 432 having a frequency $f_{LO}$ is provided to the mixer 412. The frequency $f_{LO}$ is an integer multiple of $(f_{DAC})/2$. The periodic signal 432 having the frequency $f_{LO}$ is provided to the mixer 412 for mixing with the analog signal output from the DAC 404.

In an exemplary embodiment of the invention, the frequency $f_{LO}$ is an odd-integer multiple of $(f_{DAC})/2$, for example an integer that is a member of the set {1, 3, 5, 7, 9, 11, ...}.

In an exemplary embodiment of the invention, $f_{LO}=(f_{DAC})/2$.

The DAC 404 and the mixer 412 can be any appropriate DAC or mixer, and can be equivalent to or the same as DACs and mixers used in prior art circuit arrangements. The signal 432 having frequency $f_{LO}$ that is provided to the mixer 412, can be a sin wave, a square wave, or other periodic signal waveform, that is acceptable to the mixer 412. In accordance with an exemplary embodiment of the invention, the waveform of the signal 432 depends on the type of the mixer 412. For example, passive mixers can require high level (sinusoidal) signals to switch the diode ring of the passive mixer, while active mixers can function with lower level signals that are sufficient to switch a Gilbert cell. The mixer 412 can be any type of mixer, including mixers other than multiplying-type mixers.

The signal 430 having frequency $f_{dac}$ provided to the DAC 404, can be a sin wave, a square wave, or other periodic signal waveform, that forms an acceptable clock signal (update rate signal) for the DAC 404. In an exemplary embodiment of the invention, the signals 430, 432 having the frequencies $f_{LO}$ and $f_{DAC}$ are square waves. In accordance with another exemplary embodiment, the waveform of the periodic signal 430 is different from the waveform of the periodic signal 432.

Figure 4B:
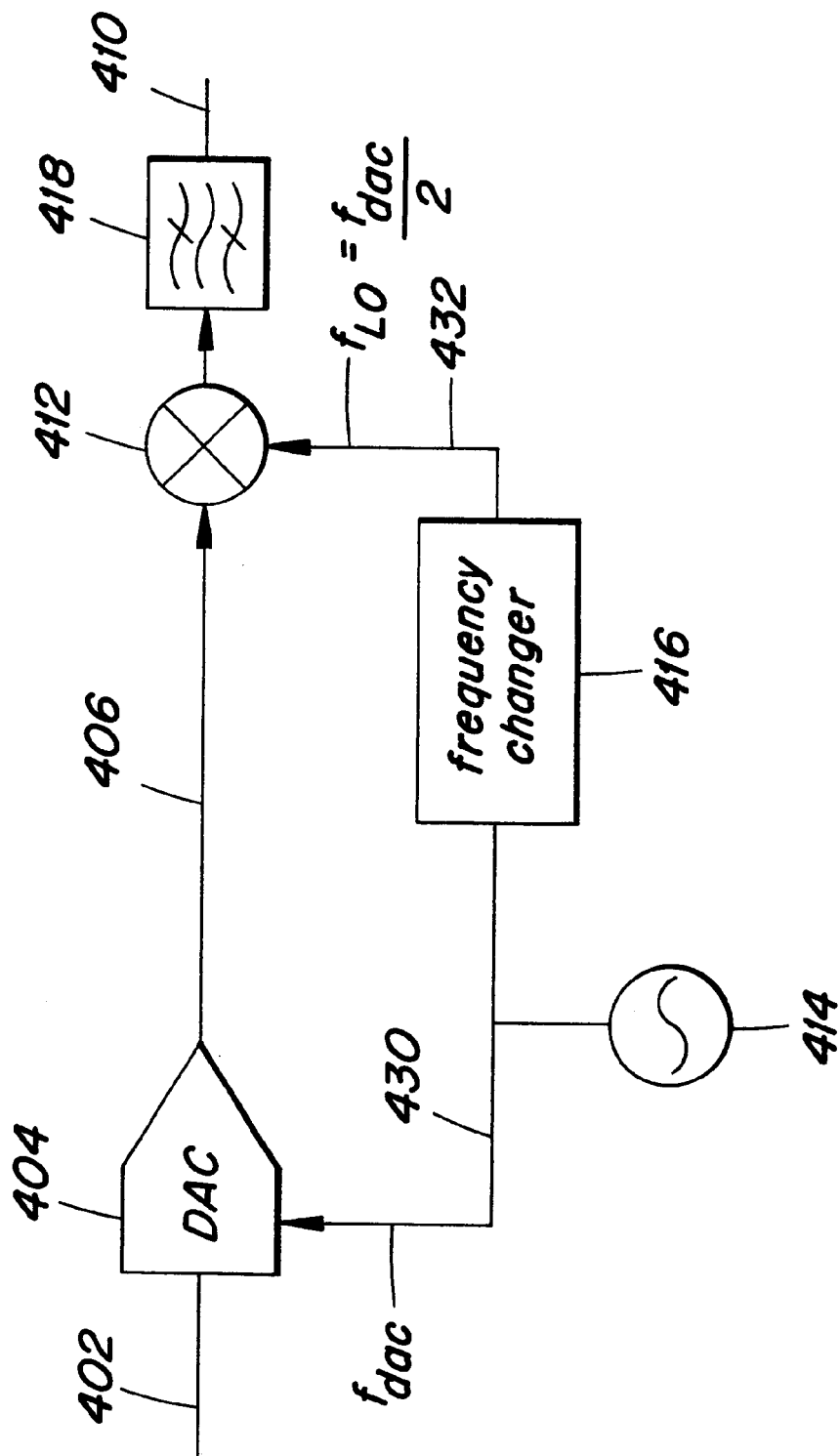
FIG. 4B shows a circuit arrangement in accordance with an exemplary embodiment of the invention.

FIG. 4B illustrates an exemplary embodiment of the present invention, wherein a local oscillator 414 is provided. The local oscillator 414 provides the update rate signal 430 to the DAC 404. Thus the frequency $f_{DAC}$ of the signal 430 output from the local oscillator 414 reflects the update rate of the DAC 404. A frequency changer 416 is also provided, to change the frequency (and optionally the waveform) of the signal 430 from the local oscillator 414, so that the signal 432 output by the frequency changer 416 has a frequency equal to $(f_{DAC})/2$. The signal 432 from the frequency changer 416 is provided to the mixer 412 for mixing with the analog signal output from the DAC 404.

In an exemplary embodiment of the invention, the frequency changer 416 is not a tank circuit.

The local oscillator 414 can be any appropriate oscillator providing an appropriate signal, and the frequency changer 416 can be any appropriate frequency changer or changer mechanism, including corresponding mechanisms known in the art. For example, the frequency changer 416 can be a commercially available frequency divider, or a commercially available frequency converter.

With respect to both FIG. 4A and FIG. 4B, any appropriate subcircuit arrangement can be used, that will provide the mixer 412 with a periodic signal having a frequency that is an integer multiple of half the frequency of the periodic signal provided to the DAC 404. For example, two separate oscillators can be provided, each having an appropriate frequency output in accordance with the invention. In an embodiment of the invention, two such separate oscillators are synchronized so their output signals are in phase. In another embodiment, the two separate oscillators are not synchronized. The frequency changer 416 can be arranged so its output signal is either in phase, or out of phase, with its input signal. In an exemplary embodiment of the invention, the output signal of the frequency changer 416 is out of phase with its input signal. The signal 432 having frequency $f_{LO}$ that is provided to the mixer 412, can be a sin wave, a square wave, or other periodic signal waveform. The signal 430 having frequency $f_{dac}$ provided to the DAC 404, can be a sin wave, a square wave, or other periodic signal waveform. The frequency changer 416 can be configured to also change the waveform of the signal 430 that it receives from the local oscillator 414, for example from a square wave to a sin wave, or from a sin wave to a square wave.

In accordance with the invention, under the condition that the highest frequency component in the desired signal (within the Nyquist band) is lower than $(f_{LO})/2$ (which is the same as ($f_{DAC}$)/4), no in-band distortion of the signal spectrum will occur. The reason is, that all spectral copies in the mixing process will either end up outside the signal band, or will superimpose on the signal itself. The spectral copies which do fall in the signal band will either add in-phase or in anti-phase to the signal.

This phase shifting of the spectral bands is caused by the linear phase characteristics of the DAC's ZOH, which causes a phase difference of 180 degrees between spectral copies spaced $f_{DAC}$ apart. Mixing with different (e.g., odd) harmonics of the local oscillator will not cause any phase difference because all harmonics are in phase with the fundamental, since the local oscillator can be modeled as a square wave. Since the phase relationship between the superimposed spectra are therefore constant and either a) zero degrees or b) 180 degrees, the only effect will be a minor change in signal amplitude.

Figure 5A:
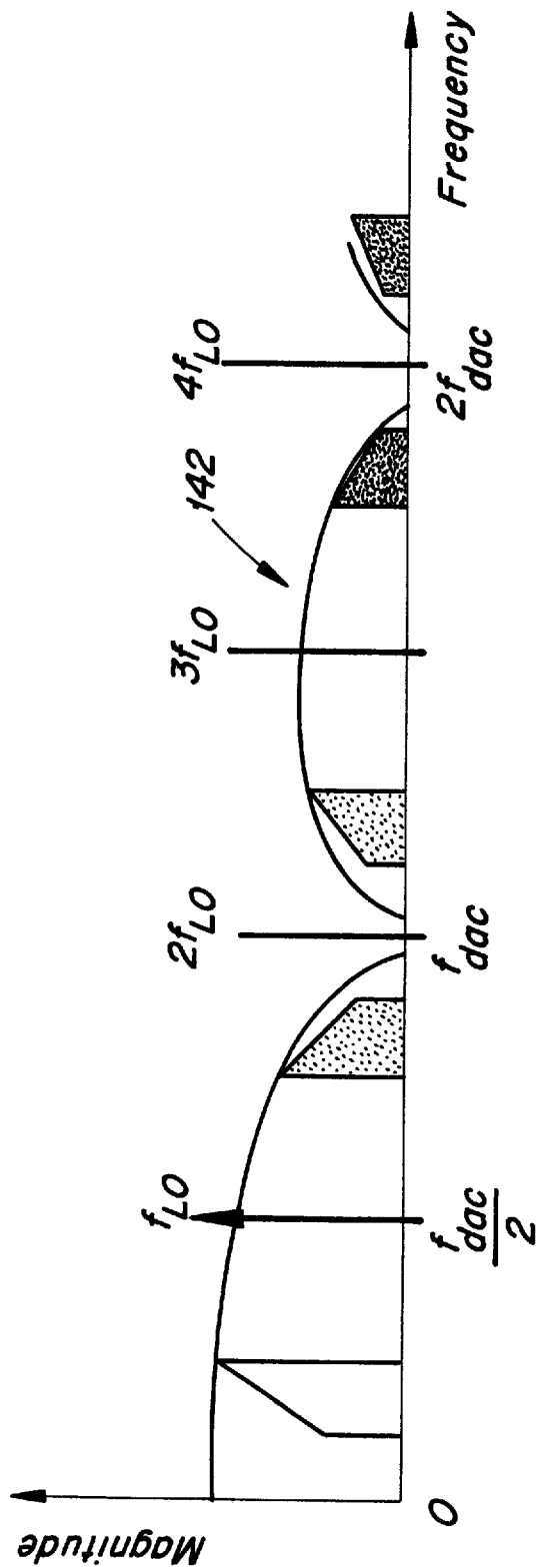
FIG. 5A shows an exemplary magnitude spectrum of a signal present at an input of the mixer shown in FIGS. 4A, 4B.
Figure 5B:
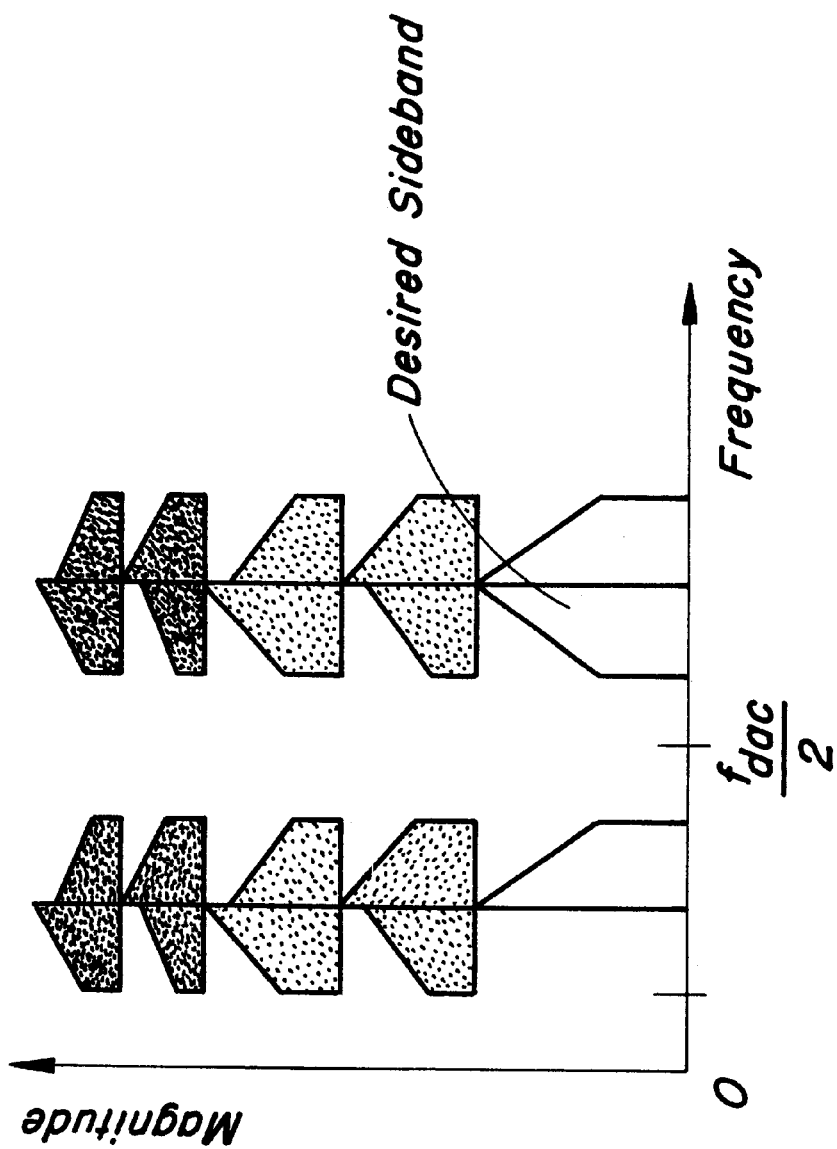
FIG. 5B shows an exemplary magnitude spectrum of a signal present at an output of the mixer shown in FIGS. 4A, 4B.

An example of the superposition of frequency converted spectral copies is shown in FIGS. 5A, 5B. In particular, FIG. 5A shows a magnitude spectrum of the signal at the input to the mixer 412. The magnitudes have a sinc response, i.e., (1/x)sin(x), due to the ZOH of the DAC 404. FIG. 5B shows a magnitude spectrum of the signal at the output of the mixer 412. The segment blocks shown in FIG. 5A are pictorially stacked in FIG. 5B, to explicitly show where the segment blocks or signal spectra of FIG. 5A are relocated in FIG. 5B.

Note that as shown in FIGS. 5A, 5B, the highest frequency component in the desired signal is exactly ($f_{LO}$)/2= ($f_{DAC}$)/4, which causes the out-of-band frequency-converted spectral copies to end up adjacent to the desired signal. In practice, the highest frequency component can be lower, so as to provide a guard band that allows the removal of the out-of-band distortion in the IF filter. The adjacent band, however, originates from mixing with the second harmonic and is therefore in practice of much lower amplitude than the desired signal.

In summary, the present invention provides many advantages over prior art solutions. For example, a bulky reconstruction filter upstream of the mixer is eliminated, thus reducing cost and size of the resulting circuit. Frequency planning is simplified for both narrowband and wideband transmitters. One signal source can be used to generate both the DAC clock and the local oscillator signal that is provided to the mixer, thus reducing circuit complexity. When one signal is used to generate both the DAC clock and the local oscillator signal $f_{LO}$, a potential noise advantage can be achieved by canceling signal generator jitter in the IF filter output signal. In addition, linearity or linear behavior of the DAC is improved by providing a low impedance load for the DAC without causing signal loss. Linearity or linear behavior of the mixer is also improved by providing a high impedance source for the mixer without causing signal loss.

It will be appreciated by those skilled in the art that the present invention can be embodied in other specific forms without departing from the spirit or essential characteristics thereof, and that the invention is not limited to the specific embodiments described herein. The presently disclosed embodiments are therefore considered in all respects to be illustrative and not restrictive. The scope of the invention is indicated by the appended claims rather than the foregoing description, and all changes that come within the meaning and range and equivalents thereof are intended to be embraced therein.

What is claimed is:

1. An apparatus comprising:
    a digital-to-analog converter (DAC) that receives a digital input signal and outputs a corresponding analog signal;
    a local oscillator that outputs a local oscillator signal at a frequency equal to an integer multiple of one-half of an update rate of the DAC; and
    a mixer that receives the output analog signal directly from the DAC, receives the output local oscillator signal, and mixes the output analog signal with the output local oscillator signal.

2. The apparatus of claim 1, wherein the frequency of the output local oscillator signal is equal to one-half of the update rate of the DAC.

3. The apparatus of claim 1, wherein the frequency of the output local oscillator signal is equal to an odd-integer multiple of one-half of the update rate of the DAC.

4. The apparatus of claim 1, further comprising:
    an intermediate frequency filter for receiving an output of the mixer, wherein the intermediate frequency filter functions as a reconstruction filter.

5. The apparatus of claim 1, wherein the apparatus is in a wideband transmitter.

6. The apparatus of claim 1, wherein the apparatus is in a narrowband transmitter.

7. The apparatus of claim 1, wherein a low impedance load is provided to the DAC by the mixer, and a high impedance source is provided to the fixer by the DAC.

8. The apparatus of claim 1, further comprising:
    a signal generator that generates an output signal utilized to generate the local oscillator signal and the update rate of the DAC.

9. The apparatus of claim 1, wherein the frequency of the output local oscillator signal is equal to an even-integer multiple of one-half of the update rate of the DAC.

10. A method for processing a digital signal, comprising the steps of:
    converting the digital signal to a first analog signal based on the digital signal and a first periodic signal having a first frequency; and
    mixing the first analog signal with a second periodic signal to form a second analog signal, said second periodic signal having a second frequency that is an integer multiple of one-half the first frequency of the first periodic signal.

11. The method of claim 10, wherein the mixing step includes mixing the first analog signal with a second periodic signal having a frequency that is an odd-integer multiple of one-half the first frequency.

12. The method of claim 11, wherein the step of converting is performed by a digital-to-analog converter (DAC), and the first periodic signal determines an update rate of the DAC.

13. The method of claim 12 further comprising the step of matching the impedance of the DAC and the mixer, said impedance-matching step comprising:
    providing a low impedance load to the DAC by the mixer; and
    providing a high impedance source to the mixer by the DAC.

14. The method of claim 13 further comprising, after converting the digital signal to an analog signal, the step of providing the analog signal directly from an output of the DAC to an input of the mixer, without passing through a reconstruction filter.

15. The method of claim 10, wherein the mixing step includes mixing the first analog signal with a second periodic signal having a frequency that is one-half the first frequency.

16. The method of claim 10, further comprising:
filtering the second analog signal with an intermediate frequency filter.

17. The method of claim 10, wherein the mixing step includes mixing the first analog signal with a second periodic signal having a frequency that is an even-integer multiple of one-half the first frequency.

18. A radio transmitter comprising:
means for receiving a digital signal encoded with information to be transmitted;
a digital-to-analog converter (DAC) that receives the digital signal and outputs a corresponding analog signal based on the input signal and an update rate of the DAC;
a local oscillator that outputs a local oscillator signal at a frequency equal to an integer multiple of one-half of the update rate of the DAC;
a mixer configured to:
  receive the output analog signal from the DAC;
  receive the output local oscillator signal;
  mix the output analog signal with the output local oscillator signal; and
  output a mixed analog signal; and
a power amplifier that receives the output mixed analog signal from the mixer and amplifies the mixed analog signal for transmission.

19. The radio transmitter of claim 18 wherein the DAC is connected directly to the mixer without utilizing an intervening reconstruction filter.

20. The radio transmitter of claim 19 further comprising an intermediate frequency (IF) filter connected to the mixer, said IF filter being configured to:
receive the output mixed analog signal from the mixer;
filter the mixed analog signal as a reconstruction filter; and
pass the filtered mixed analog signal to the power amplifier.

21. The radio transmitter of claim 18 wherein the local oscillator outputs a local oscillator signal at a frequency equal to an odd-integer multiple of one-half of the update rate of the DAC.

22. The radio transmitter of claim 18 wherein the local oscillator outputs a local oscillator signal at a frequency equal to an even-integer multiple of one-half of the update rate of the DAC.

* * * * *